United States Patent
Subramanian

(10) Patent No.: US 8,085,068 B1
(45) Date of Patent: Dec. 27, 2011

(54) COMBINED STATIC AND DYNAMIC FREQUENCY DIVIDER CHAINS USING THIN FILM TRANSISTORS

(75) Inventor: Vivek Subramanian, Orinda, CA (US)

(73) Assignee: Kovio, Inc., Milpitas, CA (US)

( * ) Notice: Subject to any disclaimer, the term of this patent is extended or adjusted under 35 U.S.C. 154(b) by 139 days.

(21) Appl. No.: 12/537,724

(22) Filed: Aug. 7, 2009

Related U.S. Application Data

(60) Provisional application No. 61/087,167, filed on Aug. 8, 2008.

(51) Int. Cl.
*H03K 21/00* (2006.01)
*H03K 23/00* (2006.01)
*H03K 25/00* (2006.01)

(52) U.S. Cl. .......... 327/115; 327/117; 327/118

(58) Field of Classification Search .......... 327/115, 327/117, 118
See application file for complete search history.

(56) References Cited

U.S. PATENT DOCUMENTS

2006/0208775 A1* 9/2006 Tobita et al. .......... 327/117
* cited by examiner

*Primary Examiner* — Lincoln Donovan
*Assistant Examiner* — John Poos
(74) *Attorney, Agent, or Firm* — The Law Offices of Andrew D. Fortney; Andrew D. Fortney

(57) ABSTRACT

Frequency divider circuits and architectures, and methods of implementing and using the same, are disclosed. In one embodiment, the frequency divider circuit includes a dynamic section that receives an input signal and outputs an intermediate signal that has a frequency lower than that of the input signal; and a static section that receives the intermediate signal and outputs a signal having a frequency that is lower than that of the intermediate signal. Stages in the dynamic and/or static section can be implemented using thin film transistors (TFTs). Embodiments of the present invention advantageously provide an approach that takes overcomes problems associated with the leakage and speed characteristics of TFTs.

51 Claims, 9 Drawing Sheets

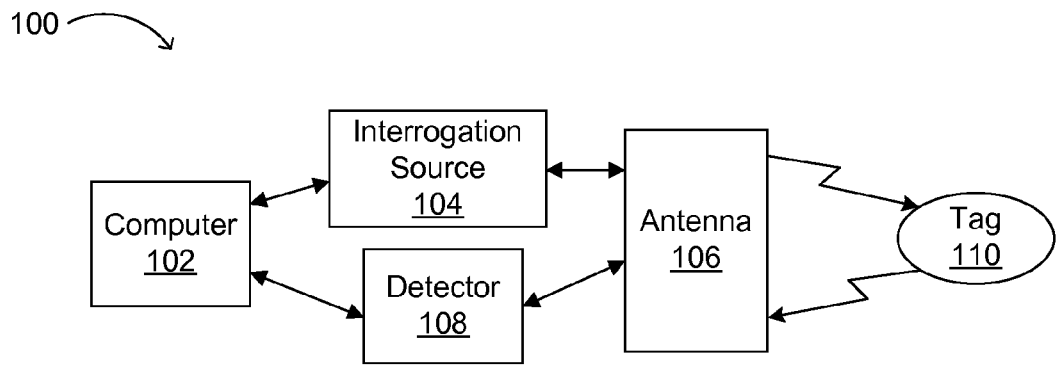
FIG. 1 (conventional)
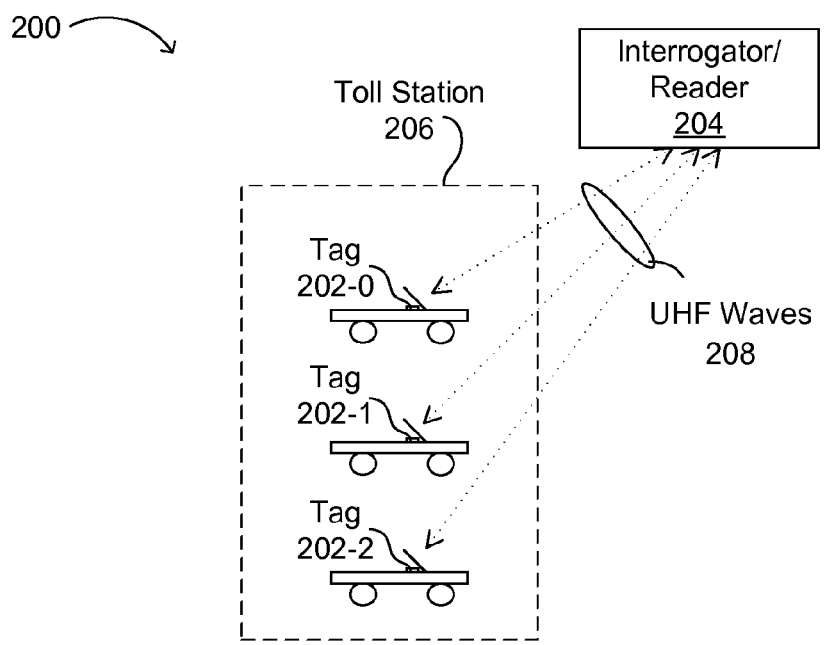
FIG. 2 (conventional)

COMBINED STATIC AND DYNAMIC FREQUENCY DIVIDER CHAINS USING THIN FILM TRANSISTORS

RELATED APPLICATIONS

This application claims the benefit of U.S. Provisional Application No. 61/087,167, filed Aug. 8, 2008, which is incorporated herein by reference in its entirety.

FIELD OF THE INVENTION

The present invention generally relates to the field of printed electronic circuitry, and in particular, flexible circuits, wireless circuits, sensor circuits, display circuits and devices, and high frequency (HF), ultrahigh frequency (UHF), and/or radio frequency (RF) circuits, including RF identification (RFID) circuits, tags, and other devices. More specifically, embodiments of the present invention pertain to frequency dividers using thin film transistors.

DISCUSSION OF THE BACKGROUND

A number of applications of integrated electronic circuits may benefit from an additive manufacturing process, such as printing. Manufacturing processes that avoid subtractive processes such as photolithographic patterning and etching may enable integrated circuitry to be formed on rigid or flexible substrates. Particularly attractive applications for such manufacturing technology include flexible display devices and identification tags (e.g., RFID tags).

Low cost RFID systems, typically including an interrogator or "reader" and an electronic label or "tag," are desirable in a variety of applications, such as retail, supply chain management, logistics, library management, and baggage claim systems, as just a few examples. Other emerging applications include vehicle toll tracking and/or management. One advantage of RFID systems over conventional barcode and magnetic media-based systems is that RFID systems can be configured to read multiple electronic labels simultaneously.

Referring now to FIG. 1, a block diagram showing a conventional RFID tag system for a single tag application is indicated by the general reference character 100. Computer 102 can connect (wirelessly or through a wired connection) to interrogation source or reader 104, which can then communicate to tag 110 via antenna 106. Tag 110 can provide information wirelessly to antenna 106 that can then be captured by detector 108 and fed back into computer 102. Tag 110 can, for example, provide a simple bit string of data back to computer 102. For example, in a retail application, tag 110 can convey to computer 102 information regarding the item to which it is attached. The information may include various attributes or properties of the item, or whether the particular item has been purchased or not.

Referring now to FIG. 2, a diagram showing a conventional UHF tag system application for reading multiple tags simultaneously is indicated by the general reference character 200. For example, toll station 206 can employ a tag system to determine whether cars passing through have arranged for payment (e.g., via a debit or a credit account) to access a road, as an alternative to each car stopping in order to pay a person in a booth at the toll station. Each car passing through may have an associated tag attached to the vehicle (e.g., tags 202-0, 202-1, and 202-2). An applied electromagnetic field can include UHF waves 208 that pass information between interrogator/reader 204 and each of tags 202-0, 202-1, and 202-2. Other such multi-tag read applications include HF, VHF and RF circuitry in the retail, library or inventory management, security, and animal (e.g., pet) identification fields, for example.

Thin film transistors (TFTs) may be used in various implementations of printed devices. In theory, TFTs can be used in forming a frequency divider for on-chip clock generation and other logic control. However, TFTs generally exhibit relatively high leakage current and relatively low switching speed, as compared to metal oxide semiconductor field effect transistors (MOSFETs) made from monocrystalline and polycrystalline silicon (e.g., monolithic circuits and/or devices).

SUMMARY OF THE INVENTION

Embodiments of the present invention relate to methods, algorithms, architectures, circuits, and/or systems for frequency dividers suitable for use in HF, VHF, UHF and/or RFID systems, as well as other flexible, display, sensor and wireless applications.

In one embodiment, a frequency divider circuit can include: (i) a dynamic section configured to receive an input signal that has a first frequency, and output an intermediate signal that has a second frequency that is lower than the first frequency; and (ii) a static section configured to receive the intermediate signal, and output a signal having a third frequency that is lower than the second frequency. Generally, thin film transistors (TFTs) can be used to implement stages in the dynamic section and/or the static section. The present frequency divider circuit can be implemented in various devices, such as radio-frequency identification (RFID) devices, other identification devices and "smart" cards, pagewide and poster-size displays (as well as other displays having a standard or non-standard size), sensors in which timing circuitry is employed, etc.

In another embodiment, a method of implementing or designing a divider circuit using thin film transistors can include (i) determining a divider ratio for a given periodic signal that has a characteristic frequency; (ii) determining a degradation tolerance of signal quality based on the characteristics of the TFTs to be included in the divider circuit (e.g., for a signal passing through a circuit composed of the TFTs); (iii) calculating a threshold frequency at which the periodic signal, divided by a divider including the TFTs, degrades beyond the degradation tolerance; and (iv) designing a dynamic divider circuit to divide the periodic signal above the threshold frequency and a corresponding static divider circuit to divide the periodic signal below the threshold frequency.

In yet another embodiment, a method of dividing a frequency of a periodic signal can include (i) dividing the periodic signal with one or more dynamic frequency divider stages, thereby creating an intermediate signal having a frequency less than that of the periodic signal, where the dynamic frequency divider stage(s) include TFTs; and (ii) dividing the intermediate signal with one or more static frequency divider stages to create an output signal having a frequency less than that of the intermediate signal, where the static frequency divider stage(s) also include TFTs.

Embodiments of the present invention can advantageously provide an approach that takes advantage of the leakage and speed characteristics of TFTs in implementing a frequency divider suitable for use in flexible circuits and wireless, display, sensor, HF, UHF and/or RFID systems. Further, embodiments of the present invention can advantageously be manufactured using printing or other additive technologies. These and other advantages of the present invention will become readily apparent from the detailed description of preferred embodiments below.

BRIEF DESCRIPTION OF THE DRAWINGS

FIG. 1 is a block diagram showing a conventional RF identification (RFID) tag system for a single tag application.

FIG. 2 is a diagram showing a conventional tag system application for reading multiple tags simultaneously.

DETAILED DESCRIPTION OF THE EMBODIMENTS

Figure 3:
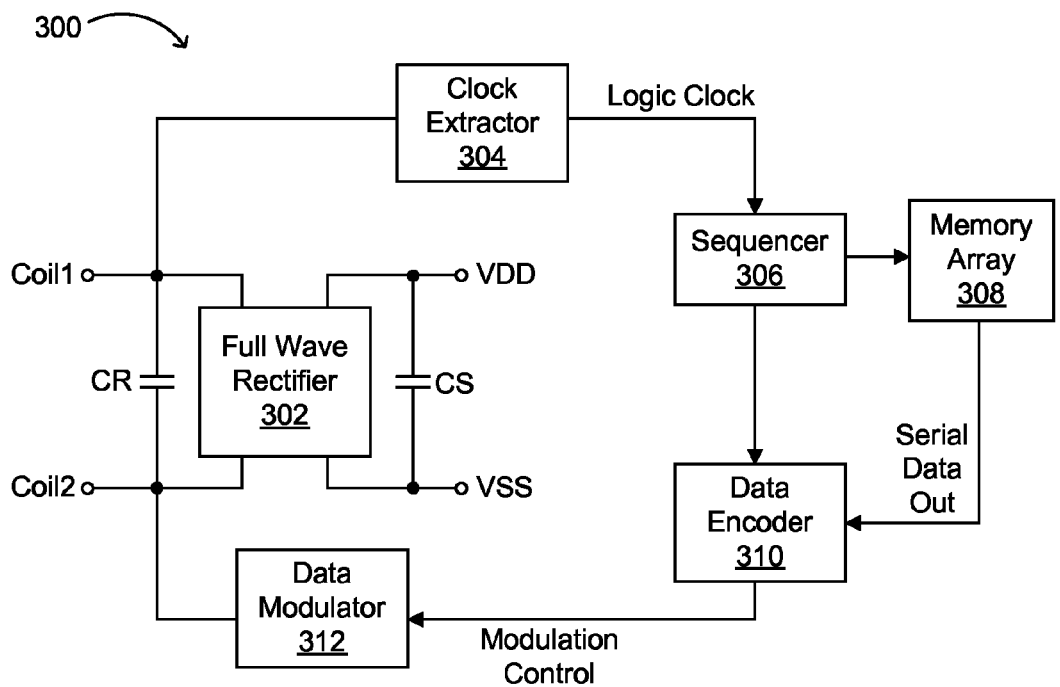
FIG. 3 is a block-level schematic diagram showing an exemplary RFID tag design suitable for use in accordance with embodiments of the present invention.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller, logic circuit, and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "bits," "bit string," "waveform" and "information" may be used interchangeably, as may the terms "connected to," "coupled with," "coupled to," and "in communication with" (which may refer to direct or indirect connections, couplings, or communications), but these terms are generally given their art-recognized meanings herein. Further, a "tag" may be a single device or a sheet and/or spool of attached structures suitable for wireless, display, sensor, flexible, high frequency (HF), very high frequency (VHF), ultra-high frequency (UHF), radio frequency (RF) and/or RF identification (RFID) applications.

In the present application, the term "deposit" (and grammatical variations thereof) is intended to encompass all forms of deposition, including blanket deposition (e.g., CVD and PVD), coating, and printing. In various embodiments, printing may comprise inkjetting, gravure printing, offset printing, flexographic printing, screen printing, slit extruding, microspotting and/or selectively pen-coating an ink formulation onto the substrate. In other embodiments, coating may comprise spin-coating, spray-coating, slit coating, extrusion coating, meniscus coating, dip coating, and/or pen-coating the ink formulation onto the substrate. In general, coating refers to a process where the ink or other material is deposited on substantially the entire substrate, whereas printing generally refers to a process where the ink or other material is deposited in a predetermined pattern in certain areas of the substrate.

In the present invention, the substrate generally comprises a mechanical support structure, which may be electrically inert or active, and which may include one or more predetermined physical, electrical and/or optical properties. Suitable electrically inert or inactive substrates may comprise a glass or other ceramic plate, disc, sheet or slip (e.g., comprising display-type glass, quartz, etc.), a dielectric and/or a plastic sheet or disc (e.g., a transparent plastic such a polycarbonate sheet, etc.), laminated variations thereof, etc. Alternatively, suitable electrically conductive substrates may comprise a semiconductor wafer or disc (e.g., a silicon wafer), a metal disc, sheet or foil (e.g., a metal film, metal sheet, and/or metal foil), etc. Any of the above-mentioned substrates may further include one or more buffer, passivation, planarization, barrier, mechanical support and/or insulating layers thereon. For example, the buffer, planarization, barrier and/or insulating layer may comprise a polyimide or other polymer layer or sheet, silicon dioxide and/or aluminum oxide, an amorphous alloy or metal compound (such as TiN), etc.

Various steps for making structures (such as TFTs) or films in the present application, as well as descriptions of printing metal, semiconductor and insulator inks and their formulations and methods of making and use, are described in one or more of U.S. Pat. Nos. 6,878,184, 6,911,385, 7,078,276, 7,152,804, 7,259,100, 7,259,101, 7,276,385, 7,286,053, 7,294,449, 7,314,513 and 7,315,068, the relevant portions of which are incorporated herein by reference, and/or one or more of the following U.S. patent applications, the relevant portions of which are incorporated herein by reference:

| Application No. | Filing Date | Attorney Docket No. |
| --- | --- | --- |
| 10/616,147 | Jul. 8, 2003 | KOV-004 |
| 10/949,013 | Sep. 24, 2004 | IDR0302 |
| 10/950,373 | Sep. 24, 2004 | IDR0301 |
| 10/956,714 | Oct. 1, 2004 | IDR0303 |
| 11/867,587 | Oct. 4, 2007 | IDR0884 |
| 11/452,108 | Jun. 12, 2006 | IDR0502 |
| 11/805,620 | May 23, 2007 | IDR0712 |
| 11/888,942 | Aug. 3, 2007 | IDR0743 |
| 11/888,949 | Aug. 3, 2007 | IDR0742 |
| 11/818,078 | Jun. 12, 2007 | IDR0813 |
| 11/842,884 | Aug. 21, 2007 | IDR0982 |
| 10/789,274 | Feb. 27, 2004 | IDR0080 |
| 11/243,460 | Oct. 3, 2005 | IDR0272 |
| 11/940,161 | Nov. 14, 2007 | IDR0852 |
| 11/203,563 | Aug. 11, 2005 | IDR0213 |
| 11/870,775 | Oct. 11, 2007 | IDR1006 |
| 11/521,924 | Sep. 15, 2006 | IDR0692 |
| 12/114,741 | May 2, 2008 | IDR1102 |
| 12/109,338 | Apr. 24, 2008 | IDR1322 |
| 12/131,002 | May 30, 2008 | IDR1263 |

Embodiments of the present invention can advantageously provide an approach that overcomes the issues and/or problems associated with the leakage and speed characteristics of TFTs in implementing a frequency divider suitable for use in wide variety of circuits and systems. Further, embodiments of the present invention can advantageously be designed, manufactured and/or otherwise implemented using printing technology. The invention, in its various aspects, will be explained in greater detail below with regard to exemplary embodiments.

Various embodiments of the present invention provide a frequency divider architecture and frequency divider circuitry that can be implemented using TFTs and/or manufactured using additive technologies (such as printing). In general, such a frequency divider includes a dynamic divider section and a static divider section. All such circuit portions can be printable in order to reduce overall system and/or manufacturing costs. Further, "on-the-fly" customization of individual tags, circuits, and devices, including the frequency dividers or sections/stages therein, during the manufacturing process can also be accommodated.

A TFT is a kind of field-effect transistor (FET) that may be made by depositing and patterning a series of thin films on or over a supporting substrate, including a semiconductor active layer (including a channel and source and drain terminals), one or more dielectric layers, a gate layer, and one or more electrical contact layers to the source and drain terminals (and, in some cases, to the gate). Optionally, the TFT includes metal electrodes to the electrical contact layers (and, in some cases, to the gate). In a silicon-based TFT, the semiconductor layer can include amorphous silicon, monocrystalline silicon, or polycrystalline silicon. Other materials used as semiconductors in TFTs include compound semiconductors (e.g., metal chalcogenides, including late transition metal chalcogenides such as cadmium selenide, and semiconducting alloys thereof), and metal oxides (e.g., zinc oxide and semiconducting alloys of metal oxides, such as zinc indium gallium oxide). TFTs can also be made using organic materials (Organic TFT or OTFT).

Frequency dividers can generally be implemented as "static," "semi-static," or "dynamic" types of circuits. A static divider circuit uses a true bi-stable circuit (which in some applications may function as a kind of memory element), whereas a dynamic divider circuit uses capacitance (e.g., parasitic capacitance or stored capacitance) to determine a value of a signal at various nodes within the circuit. The relatively low switching speeds of TFTs as compared to MOSFETs limits the effectiveness of TFTs in some applications, such as in static- and semi-static CMOS implementations of frequency dividers operating at relatively high frequencies. The high leakage current of TFTs may limit usability in dynamic dividers operating at relatively low frequencies because charge for storage may be lost through leakage prior to switching. In particular embodiments, an optimized partitioning combines dynamic and static (or semi-static) frequency divider stages using TFTs to overcome associated drawbacks of each frequency divider type.

One application of frequency dividers is for generating an on-chip clock for data sequencing, signal timing, and/or other logic or circuit control. FIG. 3 shows a block diagram 300 of an exemplary RFID tag architecture suitable for use in accordance with embodiments of the present invention. Similar architectures may be suitable for HF, VHF and UHF tags or devices. An electromagnetic field can be induced on an antenna attached at terminals Coil1 and Coil2 and across capacitor CR. The AC voltage across the coil can be rectified by full wave rectifier 302 to form a DC power supply across terminals VDD/VSS and supply capacitance, CS. The DC power supply is provided to the remaining circuit blocks in the tag 300.

RF-to-DC conversion can be achieved using one or more rectifiers (e.g., full wave rectifier 302, or alternatively, a bridge-type rectifier or other clamp circuit) or, for UHF, VHF and HF applications, thin film diode structures formed from a silicon ink (e.g., an ink containing a source of elemental silicon, such as silicon nanoparticles and/or a hydrosilane compound containing a chain of at least 5 covalently-bound silicon atoms). At HF, it is also possible to use diode-connected TFTs (i.e., a TFT having its gate connected to a source or drain of the same transistor). Thin film devices having one or more layers made from a silicon ink with mobilities of >10 $cm^2$/vs in the diode transport direction, doping in the range of $10^{17}$-$10^{20}$ $cm^{-3}$, and contact resistances on the order of $10^{-5}$ ohm-$cm^2$ provide rectification in the GHz regime, of sufficient efficiency to power an RFID circuit. GHz rectification to DC and <2 nsec gate delays have been demonstrated experimentally for a vertical thin film diode structure and a self-aligned TFT structure, respectively, having a semiconductor layer made from a silicon ink.

Demodulation of clock and data signals, encoded as a subcarrier or subcarrier modulation on the carrier RF signal, can be achieved with simple voltage detectors based on thin film diodes, or diode-connected TFTs, as described herein. Optimal signal extraction may benefit from filtering and/or tuned capacitors. In addition, logic to perform control and readout (I/O) functions can be realized with printed TFTs in CMOS or NMOS technologies, using materials as described herein. CMOS has a significant advantage over NMOS in terms of power efficiency, but may use additional process steps or additional process complexity (e.g., multiple dopant inks) compared to NMOS technology.

In the HF range, modulation is typically done by load modulation with a shunt transistor in parallel with a resonant capacitor. With a modulator TFT made from a silane ink formulation in enhancement mode, when the transistor is on, the LC coil that forms the tag's antenna is shorted. This dramatically reduces the Q of the circuit and the coupling to the reader coil. When the TFT is switched sufficiently 'off,' the Q of the LC coil is restored. In this way, a modulation signal can be passed from the tag to the reader. At UHF, similar effects also vary the scattering cross-section of the antenna and modulate the backscatter signal to the reader. This can be done with load modulation TFTs changing the impedance of the antenna, and therefore, the backscatter signal. Due to potential power losses, it may be advantageous to use a varactor-based modulation that shifts the imaginary part of the impedance of the UHF antennae using either a MOS capacitor device or a varactor diode that can be formed using the TFTs and diodes described herein.

An antenna for RFID 300 may be implemented using a resonant LC circuit for use, e.g., at about 13.56 MHz. Alternatively, the antenna may be implemented using a dipole or similar such antenna for 900 MHz or 2.4 GHz operation. Generally, the antenna may be used to provide power for operation of the tag circuitry, and to provide information from the tag to the reader or interrogator. Power can be extracted at full wave rectifier 302 by rectifying the RF signal collected by the antenna, and storing the resultant charge in a storage capacitor (e.g., CR). Thus, when a tag enters a region of space with sufficient electromagnetic field being transmitted from a nearby reader, the capacitor begins to charge up, and a voltage across the capacitor increases accordingly. When the voltage reaches a sufficient value, an enable signal can be generated to initiate circuit operation (e.g., by coupling the enable signal to clock extractor 304 and counter sequencer 306).

In an exemplary clock extractor or clock generation sub-circuit (e.g., 304), a clock signal (e.g., "logic clock") can be generated so as to synchronously operate associated circuitry (e.g., sequencer 306, a counter circuit, etc.). This clock signal may be generated by dividing down (e.g., via frequency divider circuitry) the incident RF signal received by the antenna or by dividing a demodulated clock signal from the received RF signal. This clock signal may be used to drive a counter to begin counting from a reset state when enabled. As the counter value increases, the counter output can be used to sequentially select specific bits in memory array 308 to provide serial data out to data encoder 310.

Bits provided from memory array 308 in tag or device 300 may be passed to an output stage (e.g., via data encoder 310) for information (e.g., in the form of a bit string) transfer back to a reader or interrogator. The information transfer can be accomplished by modulation (e.g., via data modulator 312) of the tag impedance. Alternatively, other common modulation schemes, such as amplitude and/or frequency shift keying may also be used in certain embodiments.

Exemplary Frequency Divider Arrangements

In one example, a frequency divider circuit includes (i) a dynamic section configured to receive an input signal that has a first frequency, and to output an intermediate signal that has a second frequency lower than the first frequency; and (ii) a static section configured to receive the intermediate signal, and output a signal having a third frequency that is lower than the second frequency. The dynamic and/or static divider sections can include TFT devices.

Figure 4:
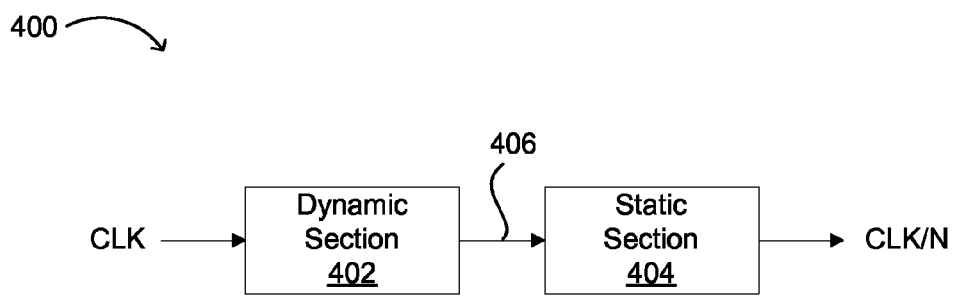
FIG. 4 is a block diagram showing an exemplary frequency divider architecture having dynamic and static divider sections in accordance with embodiments of the present invention.

FIG. 4 shows a block diagram 400 of an exemplary frequency divider with dynamic and static divider sections, in accordance with embodiments of the present invention. Dynamic section 402 receives an input clock (CLK), and provides an intermediate signal 406. Intermediate signal 406 is generally a frequency divided version of the input clock. Static section 404 receives intermediate signal 406, and provides a frequency divided clock (CLK/N), which is a frequency divided version of the intermediate signal 406, and a further frequency divided version of the input clock. When implemented in an RF, HF, VHF or UHF architecture such as architecture 300 of FIG. 3, the input clock CLK is generally from clock extractor and/or demodulator circuitry on the tag or device. As discussed above, the static circuitry may employ bi-stable memory elements, while the dynamic circuitry includes parasitic and/or other capacitances that are subject to leakage.

At relatively high frequencies, charge loss due to leakage in TFT-based dynamic dividers may not be a significant concern because the dividers can switch before charge is lost. However, such dynamic dividers may not be suitable for operation at lower frequencies because of this leakage characteristic. At relatively low frequencies, TFT-based static (or semi-static) dividers can provide good stability, while maintaining reasonable operation. However, these static and semi-static dividers may not be suitable for use at high frequencies due to relatively poor mobility in the TFTs, possibly preventing correct switching at relatively high frequencies. Thus, in particular embodiments, a frequency divider chain can be implemented using a TFT-based dynamic divider (or series of divider stages) at high frequencies (e.g., above a predetermined threshold frequency), while using a TFT-based static or semi-static divider (or series of divider stages) at low frequencies (e.g., below a predetermined threshold frequency).

Figure 5:
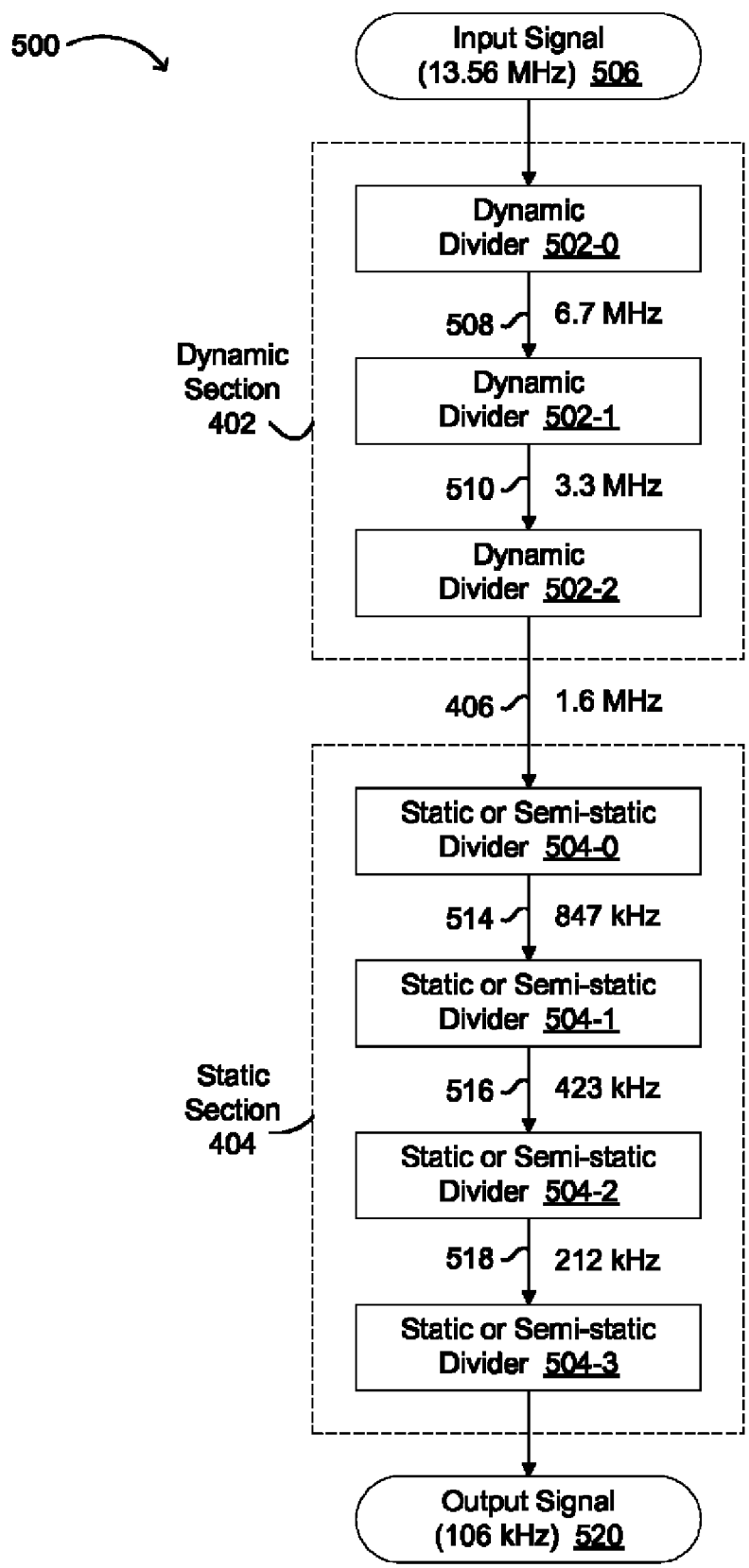
FIG. 5 is a block diagram showing an exemplary RF divider circuit in accordance with embodiments of the present invention.

FIG. 5 shows a block diagram 500 of an exemplary divider circuit in accordance with an embodiment of the present invention. In order to implement high frequency dividers using TFTs, a partitioning scheme is used to reduce or avoid the disadvantageous effects of the leakage and speed characteristics of TFTs. In this particular example, the divider circuit 500 is used to divide an incoming RF signal 506 having a frequency of about 13.56 MHz to produce an output signal 520 having a frequency of about 106 kHz. In a first part, dynamic divider section 402 divides the input signal 506 from about 13.56 MHz down to about 1.6 MHz (the characteristic frequency of intermediate signal 406), and in a second part, static divider section 404 divides the intermediate signal 406 down to about 106 kHz at (the characteristic frequency of the output signal 520).

Dynamic section 402 divides the input signal 506 using a plurality of serial stages, including first dynamic divider circuit 502-0, second dynamic divider circuit 502-1, and dynamic divider circuit 502-2. First dynamic divider circuit 502-0 produces a divided clock signal 508 having a frequency of about 6.7 MHz. Second dynamic divider circuit 502-1 produces a divided clock signal 510 having a frequency of about 3.3 MHz. Third dynamic divider circuit 502-2 produces a divided clock signal (intermediate signal 406) having a frequency of about 1.6 MHz. While each of the dynamic divider circuits 502-0, 502-1 and 502-2 are represented as divide-by-2 circuits, any dynamic divider stage may have any integer "divide-by" ratio (e.g., 3, 4, 5, 6, 8, etc.) and, optionally, any integer multiplier ratio (e.g., 3, 4, 5, 6, 8, etc.) implementable using transistor logic, as long as the intermediate signal 406 has a frequency less than that of the input signal 506. Thus, in various embodiments, the second frequency is the first frequency multiplied by p/q, where p is an integer, q is an integer greater than or equal to 2, and p/q<1. In some implementations, as described below, the intermediate signal 406 has a frequency above a predetermined threshold frequency (e.g., a maximum frequency at which static or semi-static divider circuits made using particular TFTs can operate reliably).

Static section 404 divides the intermediate signal 406 using a plurality of serial stages, including first static divider circuit 504-0, second static divider circuit 504-1, third static divider circuit 504-2, and fourth static divider circuit 504-3. First static divider circuit 504-0 produces a divided clock signal 514 having a frequency of about 847 kHz. Second static divider circuit 504-1 produces a divided clock signal 516 having a frequency of about 423 kHz. Third static divider circuit 504-2 produces a divided clock signal 518 having a frequency of about 212 kHz. Fourth static divider circuit 504-3 produces a divided clock signal (output signal 520) having a frequency of about 106 kHz. Each of the first, second, third, and fourth static divider circuits 504-0, 504-1, 504-2 and 504-3 may be static or semi-static. While each of the static divider circuits 504-0, 504-1, 504-2 and 504-3 are represented as divide-by-2 circuits, any static divider stage may have any integer "divide-by" ratio (e.g., 3, 4, 5, 6, 8, etc.) and, optionally, any integer multiplier ratio (e.g., 3, 4, 5, 6, 8, etc.) implementable using transistor logic, as long as the output signal 520 has a frequency less than that of the intermediate signal 406. Thus, in various embodiments, the third frequency is the second frequency multiplied by p'/q', where p' is an integer, q' is an integer greater than or equal to 2, and p'/q'<1. In some implementations, as described below, the output signal 520 has a frequency below the predetermined threshold frequency as described in the preceding paragraph (which may also be, e.g., a minimum frequency below which dynamic divider circuits made using particular TFTs may not operate reliably).

While three stages of dynamic dividers and four stages of static (or semi-static) divider stages are shown in this particular example, any suitable number of dynamic stages 502 (e.g., 1, 2, 4, 5, etc.) or static stages 504 (e.g., 1, 2, 3, 5, 6, 7, etc.) can be utilized in particular embodiments. In addition, different frequency divider stages can be individually enabled or disabled via any suitable form of user programming (e.g., metal layer or fuse programming, software control, etc.) or selection during the manufacturing process. In one example, printing technology can be used to control the enabling/disabling of such frequency divider stages during the manufacturing process.

Figure 6:
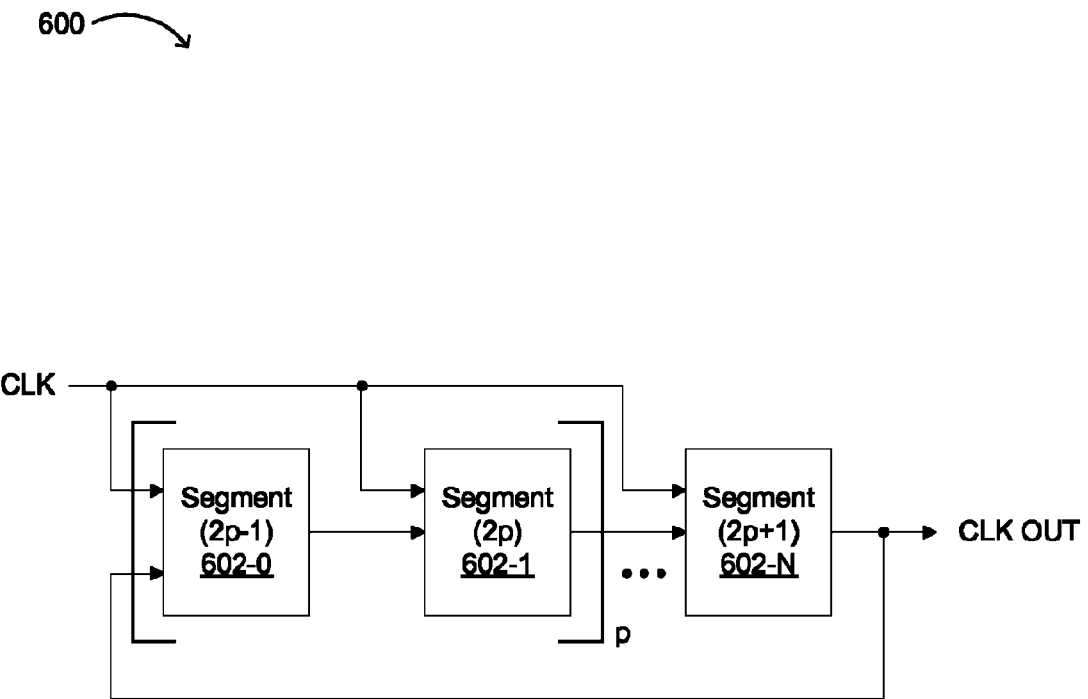
FIG. 6 is a block diagram showing an exemplary dynamic divider arrangement in accordance with embodiments of the present invention.

FIG. 6 shows a block diagram 600 of an exemplary dynamic divider arrangement in accordance with embodiments of the present invention. The dynamic divider stages can be implemented using a variety of methods. For example, arrangement 600 can be used in implementation of a dynamic divider stage 502, as shown in FIG. 5. In the particular example of FIG. 6, a number of TFT-based dynamic divider segments (e.g., segments 602-0, 602-1, . . . 602-N), with cascaded outputs and feedback (e.g., CLK OUT as an input to first segment 602-0) are used to implement a dynamic divider stage. Generally, the number of such dynamic divider segments in one dynamic divider stage can be 2p+1, where p is a positive integer. However, any suitable dynamic frequency divider arrangement or circuitry can be used in particular embodiments.

Figure 7:
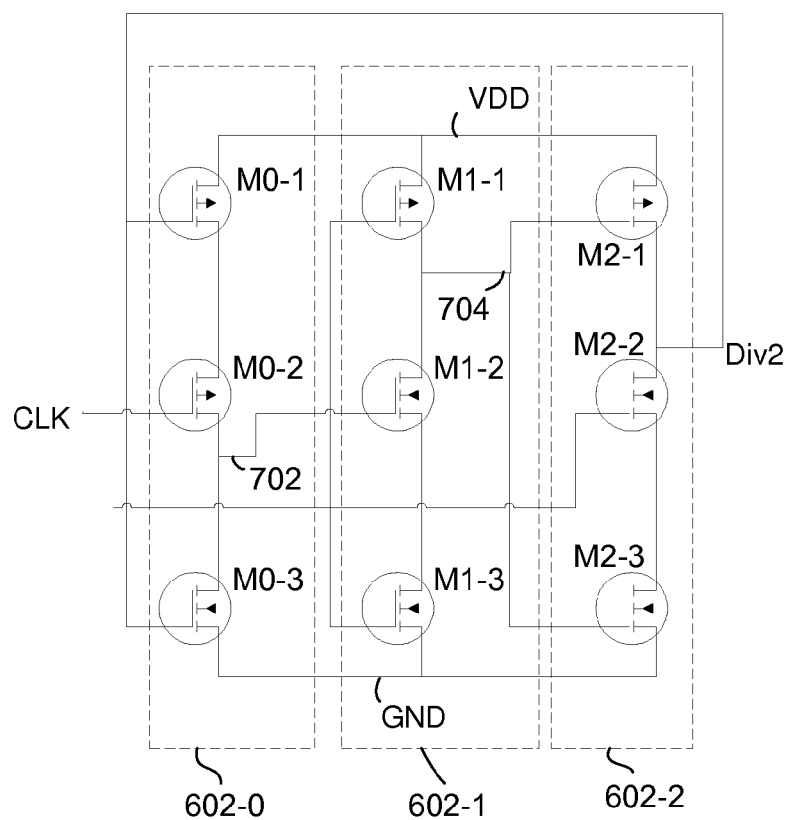
FIG. 7 is a schematic diagram showing an exemplary dynamic divider circuit designed with thin film transistors (TFTs) in accordance with embodiments of the present invention.

FIG. 7 shows a schematic diagram 700 of an exemplary dynamic divider circuit with TFTs in accordance with embodiments of the present invention. For example, three TFT-based dynamic divider segments (e.g., segments 602-0, 602-1 and 602-2 of FIG. 6) are shown in circuit 700. In FIG. 7, the input signal CLK is received at transistors M0-2, M1-1, M1-3, and M2-2. A first TFT-based dynamic divider segment 602-0 includes transistors M0-1, M0-2 and M0-3, and provides signal 702 to the gate of transistor M1-2 in the second segment 602-1. The second TFT-based segment 602-1 includes transistors M1-1, M1-2, and M1-3, and provides signal 704 to the gates of transistor M2-1 and M2-3 in the third segment 602-2. The third TFT-based segment 602-2 includes transistors M2-1, M2-2, and M2-3, and provides frequency divided signal "Div2," which can be fed back into transistors M0-1 and M0-3 in the first segment 602-0. As shown in FIG. 7, in one embodiment, each segment of the dynamic frequency divider stage 700 comprises a p-channel thin film transistor, an n-channel thin film transistor, and a third thin film transistor coupled between the p-channel and n-channel thin film transistors.

Thus, the first segment 602-0 of each dynamic frequency divider stage 700 in the frequency divider circuit may receive the output signal (e.g., Div2) of the dynamic frequency divider stage 700 as a feedback signal from a last segment (e.g., 602-2) of the dynamic frequency divider stage 700, and each successive segment (e.g., 602-1, 602-2) of the dynamic frequency divider stage receives a segment output signal from a preceding segment (e.g., 602-0, 602-1, respectively). Consequently, each segment 602-$n$ may receive a plurality of input signals, including the input signal CLK of the dynamic frequency divider stage 700 and an output signal (e.g., 702, 704, Div2) from another segment within the stage 700.

In this fashion, a frequency of the incoming signal CLK can be divided in half at output Div2, which is generally the output of the dynamic divider stage 502. Of course, while only three such TFT-based segments are shown in the particular example of FIG. 7, any number of segments (e.g., 5, 7, 9, etc., or any other odd number greater than 1) can be employed. Further, TFT sizing and other design considerations can be used to adjust circuit performance (e.g., implement a desired or predetermined operational frequency range or frequency division factor).

Figure 8:
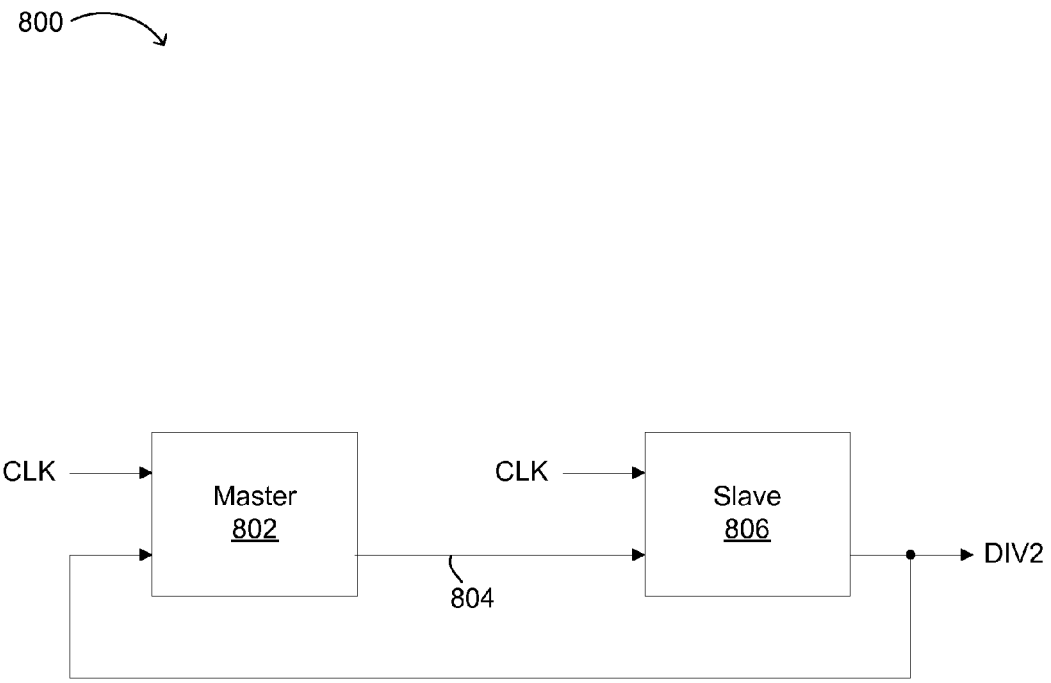
FIG. 8 is a block diagram showing an exemplary static divider arrangement in accordance with embodiments of the present invention.

FIG. 8 shows a block diagram 800 of an exemplary static divider arrangement in accordance with embodiments of the present invention. The static divider stages (e.g., static stages 504-0, 504-1, 504-2 and 504-3 of FIG. 5) can be implemented using a variety of methods. In the particular example of FIG. 8, a master-slave arrangement can be used to provide a static-type signal frequency divider circuit. In general, master stage 802 provides a signal 804 to slave stage 806, which provides frequency divided output signal DIV2. In one embodiment, each of the master stage 802 and the slave stage 806 comprise a flip-flop. Thus, each static frequency divider stage 800 may comprise a first flip-flop 802 configured to receive an input signal CLK from the preceding static frequency divider stage and a feedback signal corresponding to the static frequency divider stage output signal DIV2, and a second flip-flop configured to receive the input signal CLK from the preceding static frequency divider stage and provide the static frequency divider stage output signal DIV2.

Figure 9:
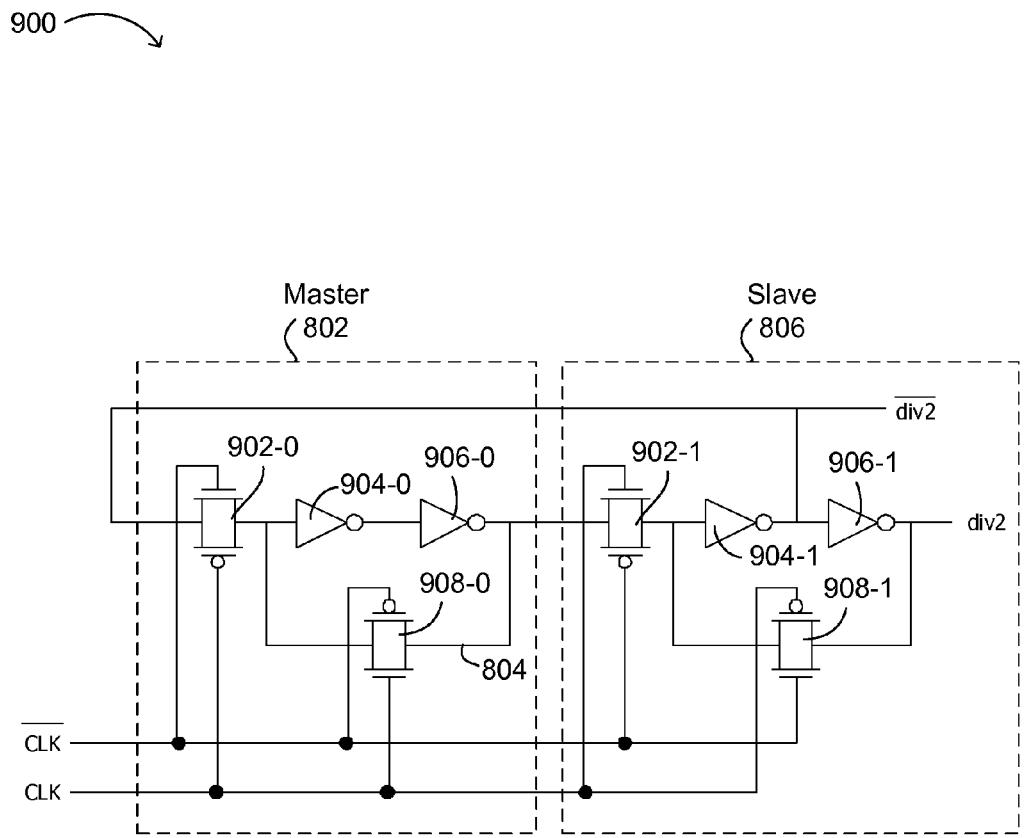
FIG. 9 is a schematic diagram showing an exemplary static divider circuit designed with TFTs in accordance with embodiments of the present invention.

FIG. 9 shows a block schematic diagram 900 of an exemplary static divider circuit including TFTs, in accordance with embodiments of the present invention. Master stage flip-flop 802 includes pass-gate 902-0, inverters 904-0 and 906-0, and pass-gate 908-0. The static memory element for the flip-flop is formed by the inverter structure (together with feedback/cross-coupling loop 804). Signal 804 is also output from master stage flip-flop 802 to slave stage flip-flop 806, which includes pass-gate 902-1, inverters 904-1 and 906-1, and pass-gate 908-1. Other types of flip-flops, logic gates, or other similar circuit arrangements can also be used in particular embodiments.

Exemplary Methods of Implementing, Designing and/or Operating a Frequency Divider In one example, a method of implementing or designing a divider circuit includes (i) determining a divider ratio for a given periodic signal having a characteristic frequency; (ii) determining a degradation tolerance of signal quality based on the characteristics of thin film transistors in the divider circuit; (iii) calculating a threshold frequency at which the periodic signal, divided by a divider comprising the thin film transistors, degrades beyond the degradation tolerance; and (iv) designing a dynamic divider circuit to divide the periodic signal above the threshold frequency and a corresponding static divider circuit to divide the periodic signal below the threshold frequency.

Figure 10:
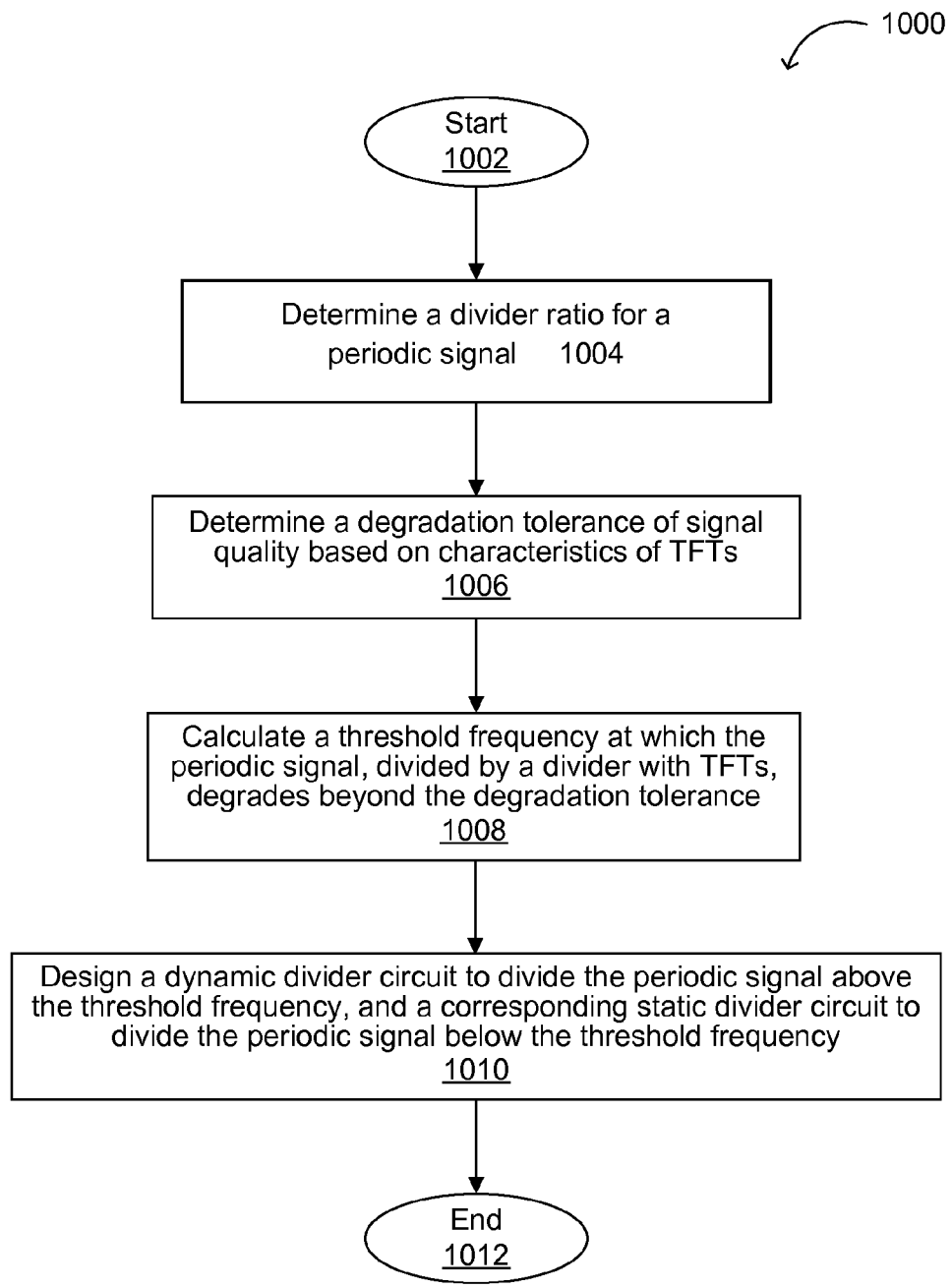
FIG. 10 is a flow diagram showing an exemplary method of implementing or designing a divider circuit using TFTs, in accordance with embodiments of the present invention.

FIG. 10 shows a flow diagram 1000 of an exemplary method of implementing a divider circuit using TFTs, in accordance with embodiments of the present invention. The flow can begin (1002), and a divider ratio can be determined for a given periodic signal that has a characteristic frequency (1004). In one example, the known frequency of the input clock or other periodic signal is divided by the desired output frequency, and the fraction or integer-to-integer ratio closest to the calculated number is used as the divider ratio. Alternatively, to simplify the design, the nearest integer ratio that is a factor of 2, 3 and/or 5 (e.g., 16, 20, 24, 32, 40, 64, 128, etc.) closest to (and optionally, greater or less than) the calculated number may be selected. Referring to the example of FIG. 5, for an input signal of about 13.56 MHz and an output signal of about 106 kHz, the divider ratio can be determined as 128, or $2^N$, where N=7, such that 7 divide-by-two stages can be employed.

In the flow of FIG. 10, the degradation tolerance of signal quality is determined based on the characteristics of the TFTs (1006). The signal for which signal quality is determined may be the periodic signal that is input into the frequency divider (e.g., the logic clock of FIG. 3 or input clock CLK of FIG. 6), or it may be a standard signal of the type used to test signal degradation (e.g., a signal that can be used to determine hysteresis properties). The degradation tolerance may be determined based on a plurality of characteristics of the thin film transistors, such as leakage (e.g., under predetermined conditions, such as a applying a maximum voltage differential across the source and drain when the transistor is off), mobility, and/or speed. Separate degradation characteristics can be determined for NMOS and PMOS transistors. A threshold frequency can be calculated at which the periodic signal, divided by a divider using the TFTs, degrades beyond the degradation tolerance (1008). Again referring to the example of FIG. 5, a suitable range for operation of dynamic dividers designed using printed TFTs made from a silane ink, doped by diffusion of dopant from a spin-on dopant, can be from about 13.56 MHz down to about 1.6 MHz, while a suitable range for static dividers can be from about 1.6 MHz down to about 106 kHz. Thus, the threshold frequency may be from about 1 MHz to about 1.5 MHz. In the flow of FIG. 10, a dynamic divider circuit can then be designed to divide the periodic signal above the threshold frequency and a corresponding static divider circuit to divide the periodic signal to a value below the threshold frequency (1010), completing the flow (1012).

In one example, a periodic signal may be divided by (i) dividing the periodic signal with one or more dynamic frequency divider stages, thereby creating an intermediate signal having a frequency less than that of the periodic signal; and (ii) dividing the intermediate signal with one or more static frequency divider stages to create an output signal having a frequency less than that of the intermediate signal. In this method, both the dynamic frequency divider stage(s) and the static frequency divider stages include TFTs.

Figure 11:
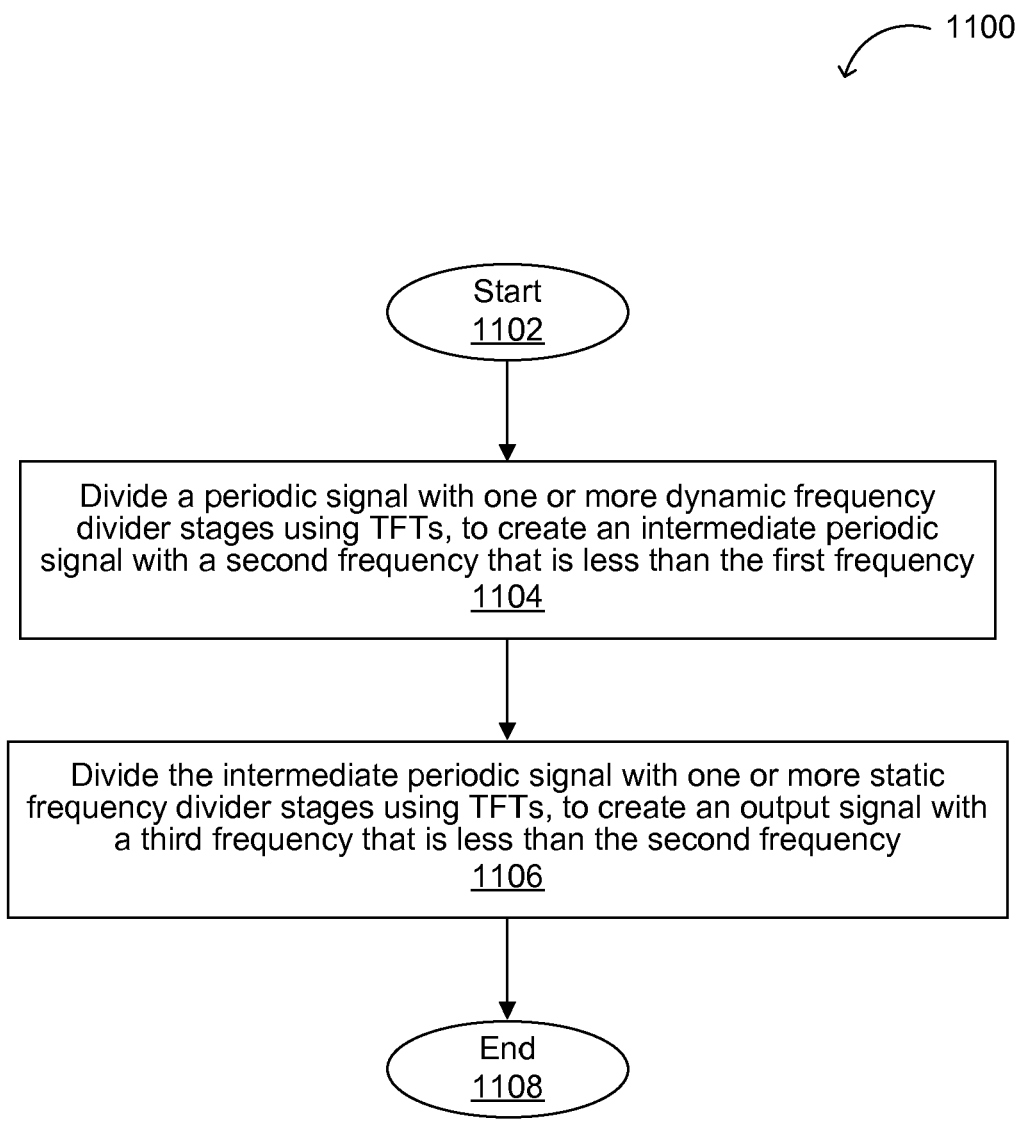
FIG. 11 is a flow diagram showing an exemplary method of dividing the frequency of a periodic signal using a divider circuit including TFTs, in accordance with embodiments of the present invention.

FIG. 11 shows a flow diagram 1100 of an exemplary method of dividing a frequency of a periodic signal using divider circuits comprising TFTs, in accordance with embodiments of the present invention. The flow begins (1102), and a periodic signal can be divided using one or more dynamic frequency divider stages as described above to create an intermediate signal (1104). The intermediate signal is generally periodic, and it has a frequency less than the frequency of the input periodic signal. As shown in the particular example of FIG. 5, three dynamic divider stages 502 can be used. While relatively simple embodiments may divide the periodic signal by an integer ratio, the periodic signal may be divided by any fractional ratio less than one, as long as frequency of the produced intermediate signal is about the threshold frequency (as described herein).

In the flow of FIG. 11, the intermediate periodic signal can then be divided using one or more static frequency divider stages, to create an output signal having a third frequency less than the second frequency (1106), thereby completing the flow (1108). As shown in the particular example of FIG. 5, four static divider stages 504 can be used. In addition, the dynamic frequency divider stages (see, e.g., FIG. 7) and/or the static frequency divider stages (see, e.g., FIG. 9) generally include TFTs.

While the above examples include particular implementations of frequency divider and other tag circuitry, one skilled in the art will recognize that other technologies may also be used. For example, transistor types other than TFT transistors can be used in certain embodiments. Further, one skilled in the art will recognize that other forms of signaling and/or control (e.g., current-based signaling, differential signaling, etc.) may also be used in accordance with various embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A frequency divider circuit, comprising:
   a) a dynamic section configured to receive an input signal having a first frequency, and to output an intermediate signal having a second frequency lower than the first frequency, wherein the dynamic section comprises a plurality of dynamic frequency divider stages, a first dynamic frequency divider stage receiving the input signal having the first frequency, a last dynamic frequency divider stage providing the intermediate signal having the second frequency, each dynamic frequency divider stage comprises a plurality of thin film transistors and a loop of 2p+1 segments, where p is an integer greater than or equal to 1, and each dynamic frequency divider stage after the first dynamic frequency divider stage, if present, receiving as an input an output from a preceding dynamic frequency divider stage; and
   b) a static section configured to receive the intermediate signal, and to output a signal having a third frequency lower than the second frequency, wherein the dynamic and static sections comprise a plurality of thin film transistors.

2. The frequency divider circuit of claim 1, wherein each segment of the dynamic frequency divider stage receives the input signal of the dynamic frequency divider stage and provides a segment output signal.

3. The frequency divider circuit of claim 1, wherein each dynamic frequency divider stage comprises:
   a) a first segment receiving a plurality of input signals including a dynamic frequency divider stage input signal and a last segment output signal, the first segment operatively producing a first segment output signal;
   b) one or more next segments, each receiving a plurality of input signals including the dynamic frequency divider stage input signal and a preceding segment output signal, each next segment operatively producing a next segment output signal; and
   c) a last segment receiving a plurality of input signals including the dynamic frequency divider stage input signal and one next segment output signal, the last segment operatively producing a dynamic frequency divider stage output signal.

4. The frequency divider circuit of claim 3, wherein each segment of each dynamic frequency divider stage comprises:
   a) a first thin film transistor having a first gate,
   b) a second thin film transistor having a second gate, the first and second gates receiving a common input; and
   c) a third thin film transistor having a first source/drain terminal coupled to a source/drain terminal of the first thin film transistor and a second source/drain terminal coupled to a source/drain terminal of the second thin film transistor.

5. The frequency divider circuit of claim 1, wherein the second frequency is the first frequency multiplied by p/q, where p is an integer, q is an integer greater than or equal to 2, and p/q<1.

6. The frequency divider circuit of claim 1, wherein the second frequency is the first frequency divided by $2^n$, where n is an integer greater than or equal to 1.

7. The frequency divider circuit of claim 1, wherein the third frequency is the second frequency multiplied by p'/q', where p' is an integer, q' is an integer greater than or equal to 2, and p'/q'<1.

8. The frequency divider circuit of claim 1, wherein the third frequency is the second frequency divided by $2^m$, where m is an integer greater than or equal to 1.

9. The frequency divider circuit of claim 1, wherein the static section comprises a plurality of static frequency divider stages, a first static frequency divider stage receiving the intermediate signal having the second frequency, and a last static frequency divider stage providing the output signal having the third frequency.

10. The frequency divider circuit of claim 9, further comprising one or more third static frequency divider stages between the first static frequency divider stage and the last static frequency divider stage, each third static frequency divider stage receiving as an input an output from a preceding stage.

11. The frequency divider circuit of claim 1, wherein the first frequency has a value from about 30 kHz to about 3 GHz.

12. The frequency divider circuit of claim 11, wherein the second frequency has a value from about 100 kHz to about 10 MHz.

13. The frequency divider circuit of claim 12, wherein the third frequency has a value from about 1 kHz to about 1 MHz.

14. The frequency divider circuit of claim 1, wherein the dynamic section comprises at least two dynamic divider stages and the static section comprises at least two static divider stages.

15. A radio frequency identification (RFID) semiconductor chip comprising the frequency divider circuit according to claim 1.

16. The RFID semiconductor chip of claim 15, further comprising a memory and a sequencer for accessing the memory, wherein the frequency divider circuit is configured to generate a clock for controlling the sequencer.

17. The frequency divider circuit of claim 1, wherein each static frequency divider stage comprises first and second flip-flops in a master-slave arrangement.

18. The frequency divider circuit of claim 17, wherein each static frequency divider stage receives an input signal having a frequency f, and outputs a signal having a frequency f/n, where n is an integer value greater than 1.

19. The frequency divider circuit of claim 1, wherein the plurality of flip-flops in each static frequency divider stage comprise first and second flip-flops in a master-slave arrangement.

20. The frequency divider circuit of claim 19, wherein each static frequency divider stage receives an input signal having a frequency f, and outputs a signal having a frequency f/n, where n is an integer value greater than 1.

21. A frequency divider circuit, comprising:
   a) a dynamic section configured to receive an input signal having a first frequency, and to output an intermediate signal having a second frequency lower than the first frequency; and
   b) a static section configured to receive the intermediate signal, and to output a signal having a third frequency lower than the second frequency, wherein the static section comprises a plurality of static frequency divider stages, a first static frequency divider stage receiving the intermediate signal having the second frequency, a last static frequency divider stage providing the output signal having the third frequency, one or more third static frequency divider stages between the first static frequency divider stage and the last static frequency divider stage, each third static frequency divider stage receiving as an input an output from a preceding stage, and wherein the dynamic and static sections each comprise a plurality of thin film transistors.

22. The frequency divider circuit of claim 21, wherein each static frequency divider stage receives an input signal having a frequency f, and outputs a signal having a frequency f/n, where n is an integer value greater than 1.

23. The frequency divider circuit of claim 21, wherein the dynamic section comprises a plurality of dynamic frequency divider stages, a first dynamic frequency divider stage receiving the input signal having the first frequency, a last dynamic frequency divider stage providing the intermediate signal having the second frequency, and each dynamic frequency divider stage after the first dynamic frequency divider stage, if present, receiving as an input an output from a preceding dynamic frequency divider stage.

24. The frequency divider circuit of claim 23, wherein each dynamic frequency divider stage comprises a plurality of thin film transistors.

25. The frequency divider circuit of claim 24, wherein each dynamic frequency divider stage comprises a loop of 2p+1 segments, where p is an integer greater than or equal to 1.

26. The frequency divider circuit of claim 21, wherein each segment of the dynamic frequency divider stage receives the input signal of the dynamic frequency divider stage and provides a segment output signal.

27. The frequency divider circuit of claim 21, wherein each dynamic frequency divider stage comprises:
  a) a first segment receiving a plurality of input signals including a dynamic frequency divider stage input signal and a last segment output signal, the first segment operatively producing a first segment output signal;
  b) one or more next segments, each receiving a plurality of input signals including the dynamic frequency divider stage input signal and a preceding segment output signal, each next segment operatively producing a next segment output signal; and
  c) a last segment receiving a plurality of input signals including the dynamic frequency divider stage input signal and one next segment output signal, the last segment operatively producing a dynamic frequency divider stage output signal.

28. The frequency divider circuit of claim 21, wherein each segment of each dynamic frequency divider stage comprises:
  a) a first thin film transistor having a first gate,
  b) a second thin film transistor having a second gate, the first and second gates receiving a common input; and
  c) a third thin film transistor having a first source/drain terminal coupled to a source/drain terminal of the first thin film transistor and a second source/drain terminal coupled to a source/drain terminal of the second thin film transistor.

29. The frequency divider circuit of claim 21, wherein the second frequency is the first frequency multiplied by p/q and the third frequency is the second frequency multiplied by p'/q', where each of p and p' is independently an integer, and each of q and q' is independently an integer greater than or equal to 2, p/q<1, and p'/q'<1.

30. The frequency divider circuit of claim 21, wherein the second frequency is the first frequency divided by $2^n$ and the third frequency is the second frequency divided by $2^m$, where n and m are each an integer greater than or equal to 1.

31. The frequency divider circuit of claim 21, further comprising one or more third static frequency divider stages between the first static frequency divider stage and the last static frequency divider stage, each third static frequency divider stage receiving as an input an output from a preceding stage.

32. The frequency divider circuit of claim 21, wherein each static frequency divider stage comprises first and second flip-flops in a master-slave arrangement.

33. The frequency divider circuit of claim 32, wherein each static frequency divider stage receives an input signal having a frequency f, and outputs a signal having a frequency f/n, where n is an integer value greater than 1.

34. A radio frequency identification (RFID) semiconductor chip comprising the frequency divider circuit according to claim 21, a memory, and a sequencer for accessing the memory, wherein the frequency divider circuit is configured to generate a clock for controlling the sequencer.

35. A frequency divider circuit, comprising:
  a) a dynamic section configured to receive an input signal having a first frequency, and to output an intermediate signal having a second frequency lower than the first frequency; and
  b) a static section configured to receive the intermediate signal, and to output a signal having a third frequency lower than the second frequency, wherein the static section comprises a first static frequency divider stage receiving the intermediate signal, and a last static frequency divider stage providing the output signal, wherein each static frequency divider stage comprises a plurality of flip-flops, and the dynamic and static sections comprise a plurality of thin film transistors.

36. The frequency divider circuit of claim 35, wherein each static frequency divider stage comprises first and second flip-flops in a master-slave arrangement.

37. The frequency divider circuit of claim 36, wherein each flip-flop comprises:
  a) a first transmission gate comprising a thin film transistor, configured to receive the input signal from the stage and the feedback signal;
  b) a second transmission gate comprising a thin film transistor, configured to receive the input signal and a feedback signal;
  c) a first inverter receiving an input signal from the first transmission gate and providing a signal; and
  d) a second inverter, receiving the signal from the first inverter and providing a flip-flop output signal.

38. The frequency divider circuit of claim 37, wherein each dynamic frequency divider stage comprises a plurality of thin film transistors.

39. The frequency divider circuit of claim 35, wherein the dynamic section comprises a plurality of dynamic frequency divider stages, a first dynamic frequency divider stage receiving the input signal having the first frequency, a last dynamic frequency divider stage providing the intermediate signal having the second frequency, and each dynamic frequency divider stage after the first dynamic frequency divider stage, if present, receiving as an input an output from a preceding dynamic frequency divider stage.

40. The frequency divider circuit of claim 39, wherein each dynamic frequency divider stage comprises a plurality of thin film transistors.

41. The frequency divider circuit of claim 40, wherein each dynamic frequency divider stage comprises a loop of 2p+1 segments, where p is an integer greater than or equal to 1.

42. The frequency divider circuit of claim 35, wherein each segment of the dynamic frequency divider stage receives the input signal of the dynamic frequency divider stage and provides a segment output signal.

43. The frequency divider circuit of claim 35, wherein each dynamic frequency divider stage comprises:
   a) a first segment receiving a plurality of input signals including a dynamic frequency divider stage input signal and a last segment output signal, the first segment operatively producing a first segment output signal;
   b) one or more next segments, each receiving a plurality of input signals including the dynamic frequency divider stage input signal and a preceding segment output signal, each next segment operatively producing a next segment output signal; and
   c) a last segment receiving a plurality of input signals including the dynamic frequency divider stage input signal and one next segment output signal, the last segment operatively producing a dynamic frequency divider stage output signal.

44. The frequency divider circuit of claim 35, wherein each segment of each dynamic frequency divider stage comprises:
   a) a first thin film transistor having a first gate,
   b) a second thin film transistor having a second gate, the first and second gates receiving a common input; and
   c) a third thin film transistor having a first source/drain terminal coupled to a source/drain terminal of the first thin film transistor and a second source/drain terminal coupled to a source/drain terminal of the second thin film transistor.

45. The frequency divider circuit of claim 35, wherein the second frequency is the first frequency multiplied by p/q and the third frequency is the second frequency multiplied by p'/q', where each of p and p' is independently an integer, and each of q and q' is independently an integer greater than or equal to 2, p/q<1, and p'/q'<1.

46. The frequency divider circuit of claim 35, wherein the second frequency is the first frequency divided by $2^n$ and the third frequency is the second frequency divided by $2^m$, where n and m are each an integer greater than or equal to 1.

47. The frequency divider circuit of claim 35, further comprising one or more third static frequency divider stages between the first static frequency divider stage and the last static frequency divider stage, each third static frequency divider stage receiving as an input an output from a preceding stage.

48. A radio frequency identification (RFID) semiconductor chip comprising the frequency divider circuit according to claim 35, a memory, and a sequencer for accessing the memory, wherein the frequency divider circuit is configured to generate a clock for controlling the sequencer.

49. A method of dividing a frequency of a periodic signal having a first frequency, comprising:
   a) dividing the periodic signal using one or more dynamic frequency divider stages, creating an intermediate periodic signal having a second frequency less than the first frequency, wherein the one or more dynamic frequency divider stages comprise a first dynamic frequency divider stage receiving the input signal having the first frequency, a last dynamic frequency divider stage providing the intermediate signal having the second frequency, each dynamic frequency divider stage comprises a plurality of thin film transistors and a loop of 2p+1 segments, where p is an integer greater than or equal to 1, and each dynamic frequency divider stage after the first dynamic frequency divider stage, if present, receiving as an input an output from a preceding dynamic frequency divider stage; and
   b) dividing the intermediate periodic signal using one or more static frequency divider stages to create an output signal having a third frequency less than the second frequency, wherein the one or more static frequency divider stages comprise TFTs.

50. A method of dividing a frequency of a periodic signal having a first frequency, comprising:
   a) dividing the periodic signal using one or more dynamic frequency divider stages, creating an intermediate periodic signal having a second frequency less than the first frequency, wherein the one or more dynamic frequency divider stages comprise thin film transistors (TFTs); and
   b) dividing the intermediate periodic signal using one or more static frequency divider stages to create an output signal having a third frequency less than the second frequency, wherein the one or more static frequency divider stages comprise TFTs, a first static frequency divider stage receiving the intermediate signal having the second frequency, a last static frequency divider stage providing the output signal having the third frequency, and one or more third static frequency divider stages between the first static frequency divider stage and the last static frequency divider stage, each third static frequency divider stage receiving as an input an output from a preceding stage.

51. A method of dividing a frequency of a periodic signal having a first frequency, comprising:
   a) dividing the periodic signal using one or more dynamic frequency divider stages, creating an intermediate periodic signal having a second frequency less than the first frequency, wherein the one or more dynamic frequency divider stages comprise thin film transistors (TFTs); and
   b) dividing the intermediate periodic signal using one or more static frequency divider stages to create an output signal having a third frequency less than the second frequency, wherein the one or more static frequency divider stages comprise TFTs, a first static frequency divider stage receiving the intermediate signal having the second frequency, a last static frequency divider stage providing the output signal having the third frequency, and wherein each static frequency divider stage comprises a plurality of flip-flops.

* * * * *